US006503692B2

(12) United States Patent
Angelopoulos et al.

(10) Patent No.: US 6,503,692 B2
(45) Date of Patent: Jan. 7, 2003

(54) ANTIREFLECTIVE SILICON-CONTAINING COMPOSITIONS AS HARDMASK LAYER

(75) Inventors: Marie Angelopoulos, Cortlandt Manor, NY (US); Ari Aviram, Croton-on-Hudson, NY (US); C. Richard Guarnieri, Somers, NY (US); Wu-Song Huang, Poughkeepsie, NY (US); Ranee Kwong, Wappingers Falls, NY (US); Wayne M. Moreau, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/165,582

(22) Filed: Jun. 7, 2002

(65) Prior Publication Data

US 2002/0187422 A1 Dec. 12, 2002

Related U.S. Application Data

(62) Division of application No. 09/602,967, filed on Jun. 23, 2000, now Pat. No. 6,420,088.

(51) Int. Cl.[7] .................................................. G03F 7/00
(52) U.S. Cl. ....................................................... 430/310
(58) Field of Search ................................. 430/310, 323

(56) References Cited

U.S. PATENT DOCUMENTS 5,346,980 A * 9/1994 Babu ........................... 528/32
6,268,457 B1 * 7/2001 Kennedy et al. ....... 106/287.13

* cited by examiner

*Primary Examiner*—Hoa Van Le
(74) *Attorney, Agent, or Firm*—Steven Capella

(57) ABSTRACT

Antireflective compositions characterized by the presence of an SiO-containing polymer having pendant chromophore moieties are useful antireflective coating/hardmask compositions in lithographic processes. These compositions provide outstanding optical, mechanical and etch selectivity properties while being applicable using spin-on application techniques. The compositions are especially useful in lithographic processes used to configure underlying material layers on a substrate, especially metal or semiconductor layers.

9 Claims, No Drawings

ANTIREFLECTIVE SILICON-CONTAINING COMPOSITIONS AS HARDMASK LAYER

This is a division of Ser. No. 09/602,967 filed Jun. 23, 2000 now U.S. Pat. No. 6,420,088.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

For some lithographic imaging processes, the resist used does not provide sufficient resistance to subsequent etching steps to enable effective transfer of the desired pattern to a layer underlying the resist. In many instances (e.g., where an ultrathin resist layer is desired, where the underlying material to be etched is thick, where a substantial etching depth is required, and/or where it is desired to use certain etchants for a given underlying material), a so-called hardmask layer is used intermediate between the resist layer and the underlying material to be patterned by transfer from the patterned resist. The hardmask layer receives the pattern from the patterned resist layer and should be able withstand the etching processes needed to transfer the pattern to the underlying material.

Also, where the underlying material layer is excessively reflective of the imaging radiation used to pattern the resist layer, typically a thin antireflective coating may be applied between the underlying layer and the resist layer. In some instances, the antireflection and hardmask functions may be served by the same material.

While many hardmask and antireflective coating materials exist in the prior art, there is a continued desire for improved compositions. Many of the prior art materials are difficult to apply to the substrate, e.g., they may require use of chemical or physical vapor deposition, and/or high temperature baking. It would be desirable to have antireflective coating/hardmask compositions which could be applied by spin-coating techniques without need for a high temperature bake. Additionally, it is desirable to have hardmask compositions which can be easily etched selective to the overlying photoresist while being resistant to the etch process needed to pattern the underlying layer, especially where the underlying layer is a metal layer.

SUMMARY OF THE INVENTION

The invention encompasses novel antireflective coating/hardmask compositions which are useful in lithographic processes. These compositions provide outstanding optical, mechanical and etch selectivity properties while being applicable using spin-on application techniques. The antireflective compositions are characterized by the presence of an SiO containing polymer having pendant chromophore moieties. The invention also encompasses lithographic structures containing the antireflective coating/hardmask composition of the invention, methods of making such lithographic structures and methods of using such lithographic structures to pattern underlying material layers on a substrate.

In one aspect, the invention encompasses a composition suitable for formation of a spin-on antireflective layer, the composition comprising:

(a) a polymer containing SiO moieties and chromophore moieties, (b) a crosslinking component, and (c) an acid generator.

The SiO moieties are preferably selected from the group consisting of siloxane moieties and silsesquioxane moieties. The SiO moieties are preferably in a backbone portion of the polymer. The SiO-containing polymer also preferably contains a plurality of reactive sites distributed along the polymer for reaction with the crosslinking component. The acid generator is preferably a thermally activated acid generator.

In another aspect, the invention encompasses a lithographic structure on a substrate, the structure comprising:

(a) an antireflective layer comprising a crosslinked polymer containing SiO moieties and chromophore moieties, and (b) a radiation-sensitive imaging layer over the antireflective layer.

In another aspect, the invention encompasses method of forming a patterned material feature on a substrate, the method comprising:

(a) providing a material layer on a substrate, (b) forming an antireflective layer over the material layer, the antireflective layer comprising a crosslinked polymer containing SiO moieties and chromophore moieties, (c) forming a radiation-sensitive imaging layer over the antireflective layer, (d) patternwise exposing the imaging layer to radiation thereby creating a pattern of radiation-exposed regions in the imaging layer, (e) selectively removing portions of the imaging layer and the antireflective layer to expose portions of the material layer, and (f) etching the exposed portions of the material layer, thereby forming the patterned material feature.

The material to be patterned is preferably a conductive, semiconductive, magnetic or insulative material, more preferably a metal. The SiO moieties are preferably in a backbone portion of the polymer. The SiO-containing polymer also preferably contains a plurality of reactive sites distributed along the polymer for reaction with the crosslinking component.

The invention also encompasses methods of making lithographic structures. These and other aspects of the invention are discussed in further detail below.

DETAILED DESCRIPTION OF THE INVENTION

The invention encompasses novel antireflective coating/hardmask compositions which are useful in lithographic processes. These antireflective compositions are characterized by the presence of an SiO-containing polymer having pendant chromophore moieties. The invention also encompasses lithographic structures containing the antireflective coating/hardmask composition of the invention, methods of making such lithographic structures and methods of using such lithographic structures to pattern underlying material layers on a substrate.

The antireflective compositions of the invention generally comprise:

(a) a polymer containing SiO moieties and chromophore moieties, (b) a crosslinking component, and (c) an acid generator.

The polymer containing SiO moieties may be a polymer containing SiO moieties in the polymer backbone and/or in pendant groups. Preferably, the polymer contains SiO moieties in its backbone. The polymer is preferably an organosiloxane, more preferably organosilsesquioxane. The polymer should have solution and film-forming characteristics conducive to forming a layer by conventional spin-coating. In addition to the chromophore moieties discussed below, the SiO-containing polymer also preferably contains a plurality of reactive sites distributed along the polymer for reaction with the crosslinking component.

Examples of suitable polymers include polymers having the silsesquioxane (ladder or network) structure. Such polymers preferably contain monomers having structures (I) and (II) below:

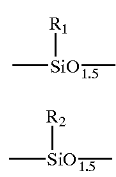

where $R_1$ comprises a chromophore and $R_2$ comprises a reactive site for reaction with the crosslinking component.

Alternatively, general linear organosiloxane polymers containing monomers (III) and (IV) can be used:

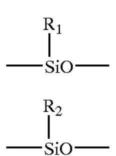

where $R_1$ and $R_2$ are as described above. In some cases, the polymer contain various combinations of monomers (I)–(IV) such that the average structure for $R_1$-containing monomers may be represented as structure (V) below and the average structure for $R_2$-containing monomers may be represented by structure (VI) below:

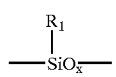

-continued

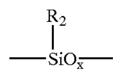

where x is from about 1 to about 1.5. In theory, x may be greater than 1.5, however, such composition generally do not possess characteristics suitable for spin-coating processes (e.g., they form undesirable gel or precipitate phases).

Generally, silsesquioxane polymers are preferred on the basis of superior etch resistance. If the ordinary organosiloxane polymers are used (e.g., monomers of structures (III) and (IV)), then preferably, the degree of crosslinking is increased compared to formulations based on silsesquioxanes.

The chromophore-containing groups $R_1$ may contain any suitable chromophore which (i) can be grafted onto the SiO-containing polymer (ii) has suitable radiation absorption characteristics, and (iii) does not adversely affect the performance of the layer or any overlying photoresist layers. Preferred chromophore moieties include chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. 9-anthracene methanol is a preferred chromophore. The chromophore moiety preferably does not contain nitrogen, except for possibly deactivated amino nitrogen such as in phenol thiazine.

The chromophore moieties may be chemically attached to the SiO containing polymer by acid-catalyzed O-alkylation or C-alkylation such as by Friedel-Crafts alkylation. Alternatively, the chromophore moiety may be attached by an esterification mechanism. A preferred acid for Friedel-Crafts catalysis is HCl. Preferably, about 15 to 40% of the functional groups ($R_1$) contain chromophore moieties. In some instances, it may be possible to bond the chromophore to the monomer before formation of the SiO-containing polymer, however this is generally not preferred. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R_2$ comprises a reactive site for reaction with the crosslinking component. Preferred reactive moieties contained in $R_2$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the SiO-containing polymer (before attachment of the chromophore) is poly(4-hydroxybenzylsilsesquioxane). Examples of other silsesquioxane polymers of the invention include:

poly(p-hydroxyphenylethylsilsesquioxane), poly(p-hydroxyphenylethylsilsesquioxane-co-p-hydroxy-α-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-α-methylbenzylsilsesquioxane), poly(p-hydroxy-α-methylbenzylsilsesquioxane-co-p-hydroxybenzylsilsesquioxane), poly(p-hydroxy-α-methylbenzylsilsesquioxane-co-methoxybenzylsilsesquioxane), poly(p-hydroxy-α-methylbenzylsilsesquioxane-co-t-butylsilsesquioxane), poly(p-hydroxy-α-methylbenzylsilsesquioxane-co-cyclohexylsilsesquioxane), poly(p-hydroxy-α-methylbenzylsilsesquioxane-co-phenylsilsesquioxane), poly(p-hydroxy-α-methylbenzylsilsesquioxane-co-bicycloheptylsilsesquioxane), and poly(p-hydroxybenzylsilsesquioxane-co-p-hydroxyphenylethylsilsesquioxane). The polyorganosiloxane polymers described in U.S. Pat. No. 5,100,503 are generally not useful for creating low temperature bake compositions due to their very low reactivity with crosslinking components; the disclosure of this patent is incorporated herein by reference.

The SiO-containing polymers of the invention preferably have a weight average molecular weight, before reaction with the crosslinking component, of at least about 1000, more preferably a weight average molecular weight of about 1000–10000.

The crosslinking component is preferably a crosslinker that can be reacted with the SiO containing polymer in a manner which is catalyzed by generated acid and/or by heating. Generally, the crosslinking component used in the antireflective compositions of the invention may be any suitable crosslinking agent known in the negative photoresist art which is otherwise compatible with the other selected components of the composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible crosslinking agents include: 2,6-bis(hydroxymethyl)-p-cresol, compounds having the following structures:

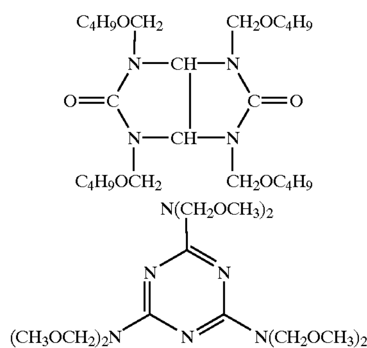

-continued

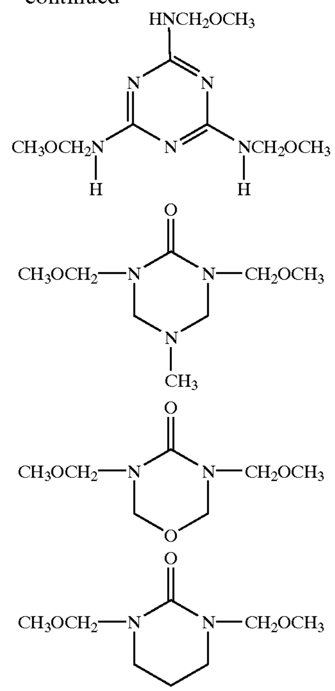

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other crosslinking agents such as bis-epoxies or bis-phenols (e.g., bisphenol-A) may also be used. Combinations of crosslinking agents may be used.

The acid generator is preferably an acid generator compound is employed that liberates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

The antireflective compositions of the invention preferably contain (on a solids basis) (i) about 50–98 wt. % of the SiO-containing polymer, more preferably about 70–80 wt. %, (ii) about 1–50 wt. % of crosslinking component, more preferably about 3–25%, most preferably about 5–25 wt. %, and (iii) about 1–20 wt. % acid generator, more preferably about 1–15 wt. %.

The antireflective coating/hardmask compositions of the Invention may be used in combination with any desired resist material in the forming of a lithographic structure. Preferably, the resist is imageable with ultraviolet radiation (e.g.<400 nm wavelength) or with electron beam radiation. Examples of suitable resist materials are described in U.S. Pat. Nos. 5,861,231; 5,962,184; and 6,037,097, the disclosures of which are incorporated herein by reference.

The antireflective compositions of the invention will typically contain a solvent prior to their application to the desired substrate. The solvent may be any solvent conventionally used with resists which otherwise does not have any excessively adverse impact on the performance of the antireflective composition. Preferred solvents are propylene glycol monomethyl ether acetate, cyclohexanone, and ethyl cellosolve acetate. The amount of solvent in the composition for application to a substrate is preferably sufficient to achieve a solids content of about 8–20 wt. %. Higher solids content formulations will generally yield thicker coating layers. The compositions of the invention may further contain minor amounts of auxiliary components (e.g., base additives, etc.) as may be known in the art.

The antireflective compositions of the invention can be prepared by combining the polymer, crosslinking component and acid generator, and any other desired ingredients using conventional methods. The compositions of the invention advantageously may be formed into antireflective layers on a substrate by spin-coating followed by baking to achieve crosslinking and solvent removal. The baking is preferably conducted at about 250° C. or less, more preferably about 150°–200° C., most preferably about 170°–180° C. The baking time may be varied depending on the layer thickness and bake temperature. A typical time at 170° would be about two minutes. The thickness of the antireflective composition of the invention may be varied depending on the desired function. For example, where the composition is used as a non-planarizing antireflective coating, the thickness may be about 50–500 nm. Where the composition is used as a planarizing hardmask, the thickness is preferably about 0.5–5.0 $\mu$m. If desired, the compositions of the invention may also be used as dielectric materials in a similar manner to conventional spin-on glass materials.

The compositions of the invention are especially useful for lithographic processes used in the manufacture of integrated circuits on semiconductor substrates. The compositions are especially useful for lithographic processes using mid-UV, 248 nm deep UV, x-ray, or e-beam or other imaging radiation.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over the material layer to be patterned, preferably by spin-coating. The composition is then baked to remove solvent and cure (crosslink) the composition. A radiation-sensitive resist layer can then be applied (directly or indirectly) over the cured antireflective composition of the invention.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the photoresist.

After solvent removal, the resist layer is then patternwise-exposed to the desired radiation (e.g. 248 nm ultraviolet radiation). Where scanning particle beams such as electron beam are used, patternwise exposure may be achieved by scanning the beam across the substrate and selectively applying the beam in the desired pattern. More typically, where wavelike radiation forms such as 248 nm ultraviolet radiation, the patternwise exposure is conducted through a mask which is placed over the resist layer. For 248 nm UV radiation, the total exposure energy is preferably about 100 millijoules/$cm^2$or less, more preferably about 50 millijoules/$cm^2$or less (e.g. 15–30 millijoules/$cm^2$).

After the desired patternwise exposure, the resist layer is typically baked to further complete the acid-catalyzed reaction and to enhance the contrast of the exposed pattern. The post-exposure bake is preferably conducted at about 60–175° C., more preferably about 90–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the layer of antireflective material of the invention by etching with $CF_4$ or other suitable etchant using techniques known in the art.

After the opening of the layer of antireflective material of the invention and any underlying antireflective coating, the underlying material layer to be patterned may then be etched using an etchant appropriate to the material layer composition. Where the material layer is a metal (e.g., Cr) a combination of $Cl_2/O_2$ may be used as a dry etchant. Once the desired pattern transfer has taken place, any remaining resist may be removed using conventional stripping techniques. If the composition of the invention is being used strictly as a hardmask or non-planarizing antireflective coating, the composition of the invention may be removed by contacting with a $CF_4/O_2$ plasma.

Thus, the compositions of the invention and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. The compositions are especially useful in the context of creating patterned metal structures, especially Cr-based structures useful as masks.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Ortho Grafting of 9-anthracenemethyl Group to Poly(4-hydroxybenzylsilsesquioxane) and the Formulation of Hardmask/antireflective Layer.

9-anthracene methanol 6.7 g was reacted with 16 g of poly(4-hydroxybenzylsilsesquioxane) in 150 g of acetonitrile containing 0.4 g of HCl. The solution was heated to reflux for several hours, and then water was added to precipitate the grafted polymer. The dried polymer was dissolved as a 14 wt. % solution in propylene glycol monomethyl ether acetate (PGMEA). Glycoluril resin (POWDERLINK crosslinking agent) and nitrobenzyl tosylate (acid generator) were added to the solution in amounts to achieve 10 wt. % of total solids and 5 wt. % of solids respectively. 200 ppm of FC430 surfactant (sold by 3M Corporation) was also added to the solution.

EXAMPLE 2

Etching the Hardmask/antireflective Layer vs. UV-80 with $CF_4/O_2$ Gas

The hardmask/antireflective layer (HM/ARC), formulated as described in Example 1, was spin-coated on hexamethyldisilazane(HMDS)-primed wafer at 3000 rpm. The spun film was cured at 175° C. for 3 minutes. A layer of UV-80 photoresist (sold by Shipley Company) was spin-coated over the cured layer at 3000 rpm. The photoresist layer was soft baked at 130° C. for 60 seconds.

Thickness measurements were made with a profilometer. To make the thickness measurements, a 13.0 nm Al strip was used as a mask; this Al is not etched in the $Cl_2/O_2$ or in the $CF_4/O_2$ plasmas.

A generic oxide etch process was used in the $CF_4/O_2$ etch with the conditions of Table I. A low pressure, high density plasma process using an inductively coupled plasma (ICP) was used. Flow rate, pressure, power and Ar dilution were selected to give a relatively stable process without the oscillations frequently encountered with these electronegative discharges. The DC self bias voltage was kept to 150 volts.

TABLE I

| Etch condition for $CF_4O_2$ | |
|---|---|
| $CF_4$ flow | 40 sccm |
| $O_2$ flow | 6 sccm |
| Ar flow | 25 sccm |
| etch pressure | 6.1 mT |
| ICP power | 400 W |
| rf substrate power | 30 W |
| dc bias voltage | −150 V |

TABLE II

| | Etch thickness and etch rate | | |
|---|---|---|---|
| Etch time | 45 s | 50 s | 90 s |
| UV80 | 179 nm (4.0 nm/s) | 227 nm (4.5 nm/s) | 402 nm (4.5 nm/s) |
| HM/ARC | 157 nm (3.5 nm/s) | 205 nm (4.1 nm/s) | >374 nm (>4.2 nm/s) |

EXAMPLE 3

Etching the Hardmask/antireflective Layer vs. UV80 with $Cl_2/O_2$ Gas

Both HM/ARC and UV80 were processed as Example 2 except the etching process which is described in Table III.

TABLE III

| Etch condition for $Cl_2O_2$ | |
|---|---|
| $Cl_2$ flow | 24 sccm |
| $O_2$ flow | 6 sccm |
| Ar flow | 25 sccm |
| etch pressure | 12 mT |
| ICP power | 500 W |
| rf substrate power | 12 W |
| dc bias voltage | −114 V |

The etch rate of HM/ARC is significantly lower than UV-80.

TABLE IV

| | Etch thickness and etch rate | |
|---|---|---|
| Etch time | 50 s | 150 s |
| UV80 | 61 nm (1.2 nm/s) | 237 nm (1.5 nm/s) |
| HM/ARC | 20 nm (0.4 nm/s) | 46 nm (0.3 nm/s) |

What is claimed is:

1. A method of forming a patterned material feature on a substrate, said method comprising:

(a) providing a material layer on a substrate, (b) forming an antireflective layer over said material layer, said antireflective layer comprising a crosslinked polymer containing SiO moieties and chromophore moieties, (c) forming a radiation-sensitive imaging layer over said antireflective layer, (d) patternwise exposing said imaging layer to radiation thereby creating a pattern of radiation-exposed regions in said imaging layer, (e) selectively removing portions of said imaging layer and antireflective layer to expose portions of said material layer, and (f) etching said exposed portions of said material layer, thereby forming said patterned material feature.

2. The method of claim 1 further comprising:

(g) removing any remaining portions of said imaging layer and said antireflective layer from material layer.

3. The method of claim 1 wherein said radiation is selected from the group consisting of (a) ultraviolet radiation having a wavelength less than 250 nm, and (b) electron beam radiation.

4. The method of claim 1 wherein said SiO moieties are selected from the group consisting of siloxane moieties and silsesquioxane moieties.

5. The method of claim 1 wherein said chromophore moieties are selected from the group consisting of chrysenes, pyrenes, fluoranthrenes, anthrones, benzophenones, thioxanthones, and anthracenes.

6. The method of claim 1 wherein said SiO moieties are in a backbone portion of said polymer.

7. The method of claim 1 wherein said antireflective layer is formed by spin-coating.

8. The method of claim 1 wherein said material layer is selected from the group consisting of dielectric metals, and semiconductors.

9. The method of claim 8 wherein said material layer comprises chromium.

* * * * *